US008630386B2

(12) United States Patent
Ellis (10) Patent No.: US 8,630,386 B2
(45) Date of Patent: Jan. 14, 2014

(54) CLOCK RECOVERY IN A BATTERY POWERED DEVICE (75) Inventor: Andrew Ellis, Winchester (GB)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/508,572

(22) PCT Filed: Nov. 24, 2010

(86) PCT No.: PCT/GB2010/051962
§ 371 (c)(1),
(2), (4) Date: May 8, 2012

(87) PCT Pub. No.: WO2011/064583
PCT Pub. Date: Jun. 3, 2011

(65) Prior Publication Data
US 2012/0230461 A1 Sep. 13, 2012

Related U.S. Application Data (60) Provisional application No. 61/264,445, filed on Nov. 25, 2009, provisional application No. 61/332,759, filed on May 8, 2010.

(30) Foreign Application Priority Data

Apr. 30, 2010 (EP) ..................................... 10161688

(51) Int. Cl.
G06M 3/00 (2006.01)
H03K 21/00 (2006.01)
(52) U.S. Cl.
USPC .................. 377/30; 377/31; 377/32; 377/107
(58) Field of Classification Search
USPC ............................................. 377/30–32, 107
See application file for complete search history.

(56) References Cited

U.S. PATENT DOCUMENTS 6,029,061 A * 2/2000 Kohlschmidt ................ 455/574
6,044,282 A * 3/2000 Hlasny .......................... 455/574
(Continued)

FOREIGN PATENT DOCUMENTS

EP   1 248 373 A1   10/2002
WO  98/20620 A1    5/1998

OTHER PUBLICATIONS

International Preliminary Report on Patentability issued in corresponding International application No. PCT/GB2010/051962, issued May 30, 2012.

(Continued)

Primary Examiner — Tuan T Lam
(74) Attorney, Agent, or Firm — Patent Portfolio Builders PLLC (57) ABSTRACT A battery powered device is able to maintain a clock value when the battery is removed for a short period. During a first time period, while the battery is in the device, clock pulses derived from a first oscillator are counted at a first rate in a first counter that represents the clock value. During a second time period following the first time period, while the battery is removed, the value of the first counter is maintained independent of any clock pulses derived from the first oscillator, clock pulses derived from a second low power oscillator are counted in a second counter. During a recovery time period following the second time period, clock pulses derived from the second oscillator are again counted in the second counter, while clock pulses derived from the first oscillator are counted in the first counter at a second rate higher than the first rate, the duration of the recovery time period being determined based on the number of pulses counted in the second counter during the second time period.

15 Claims, 11 Drawing Sheets

(56) References Cited

U.S. PATENT DOCUMENTS

| | | |
|---|---|---|
| 6,603,365 B1 * | 8/2003 | Dotzler et al. .................. 331/74 |
| 6,725,067 B1 * | 4/2004 | Marx et al. .................... 455/574 |
| 7,260,068 B2 * | 8/2007 | Hsieh et al. ................... 370/311 |
| 7,340,634 B2 * | 3/2008 | Leung et al. .................. 713/502 |
| 2002/0065117 A1 | 5/2002 | Suda |

OTHER PUBLICATIONS

International Search Report issued in corresponding International application No. PCT/GB2010/051962, mailing date Mar. 11, 2011.

Written Opinion issued in corresponding International application No. PCT/GB2010/051962, mailing date Mar. 11, 2011.

* cited by examiner

CLOCK RECOVERY IN A BATTERY POWERED DEVICE

BACKGROUND

This invention relates to clock recovery in a battery powered device, and in particular to a method for recovering a time count in the event that the battery is removed from the device.

It is known from U.S. Pat. No. 6,603,365 to provide a battery backup circuit in a wireless communications device. An oscillator is powered by the battery, and a counter counts pulses generated by the battery. At times when the battery is being replaced, a backup energy storage device, such as a capacitor, provides power to the counter so that the stored time can be saved.

However, this has the disadvantage that no power is supplied to the oscillator while the battery is removed, and so the time during that period is not counted.

U.S. Pat. No. 6,124,764 discloses a device having a second oscillator, which is operable with low power during sleep periods. The low power oscillator is calibrated against the main oscillator of the device during wake-up periods.

SUMMARY

According to a first aspect of the present invention, there is provided a method of updating a first counter in an electronic device, a value of the first counter representing a time, comprising:
   counting, during a first time period, clock pulses derived from a first oscillator in the first counter at a first rate;
   keeping, during a second time period following the first time period, a value of the first counter independent of clock pulses derived from the first oscillator during the second time period;
   counting, during the second time period, clock pulses derived from a second oscillator in a second counter;
   counting, during a recovery time period following the second time period, clock pulses derived from the second oscillator in the second counter; and
   counting, during the recovery time period, clock pulses derived from the first oscillator in the first counter at a second rate higher than the first rate, a duration of the recovery time period being determined based on the number of pulses counted in the second counter during the second time period.

According to a second aspect of the present invention, there is provided an electronic device, comprising:
   a first oscillator, for generating clock pulses;
   a first counter, wherein a value of the first counter represents a time;
   a second oscillator, for generating clock pulses; and
   a second counter,
   wherein the first counter is connected to the first oscillator such that, during a first time period, clock pulses derived from the first oscillator are counted in the first counter at a first rate, and, during a second time period following the first time period, the value of the first counter is kept independent of clock pulses derived from the first oscillator;
   wherein the second counter is connected to the second oscillator such that, during the second time period, clock pulses derived from the second oscillator are counted in the second counter, and, during a recovery time period following the second time period, clock pulses derived from the second oscillator are counted in the second counter; and
   wherein the first counter is further connected to the first oscillator such that, during the recovery time period, clock pulses derived from the first oscillator are counted in the first counter at a second rate higher than the first rate, a duration of the recovery time period being determined based on the number of pulses counted in the second counter during the second time period.

Thus, during the recovery period, the second oscillator is effectively being calibrated against the first oscillator, with the result that the duration of the recovery period can be accurately controlled, even though the second oscillator may not be well characterized.

This has the advantage that the duration of the recovery time period can be matched to the duration of the second time period, without requiring knowledge of the frequency of the clock pulses derived from the second oscillator.

DETAILED DESCRIPTION

Figure 1:
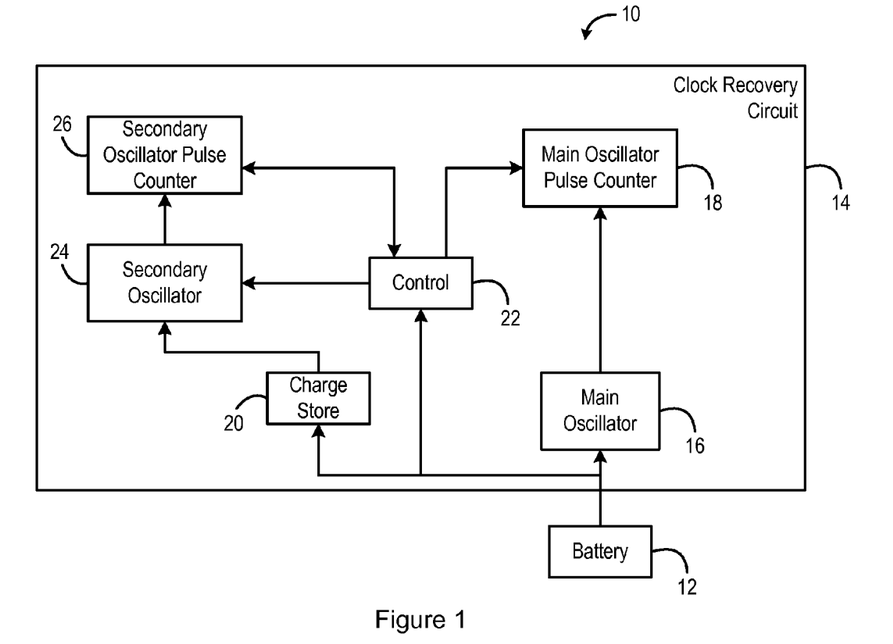
FIG. 1 is a block schematic diagram of a system in accordance with an aspect of the present invention.

FIG. 1 shows a part of a wireless communications device 10 in accordance with an aspect of the present invention. The wireless communications device 10 is powered by a battery 12, and is largely conventional, and is therefore described here only so far as is necessary for an understanding of the present invention. Specifically, FIG. 1 shows the detail of a clock recovery circuit 14, which is used for counting time, including during periods when the battery 12 is removed from the device 10 for short periods, for example for replacement of the battery itself, or for replacement of a SIM card that is physically covered by the battery 12.

Thus, the clock recovery circuit 14 includes a main oscillator 16, which may also be used to generate signals at particular frequencies for use in radio frequency communications. In this context, however, the use of the main oscillator 16 is to generate pulses at a known frequency. These pulses are supplied to a main oscillator pulse counter 18, which counts the pulses from the main oscillator 16. The number of counted pulses is used as an indication of the time of day, and this can be used by various applications running on the device 10, such as an alarm.

When the battery is removed from the device 10 for short periods, it is necessary to maintain the time of day. Therefore, while the battery 12 is present, energy is stored in a charge store 20. The power consumption of the main oscillator 16 cannot be satisfied by the charge store 20. Therefore, when the battery is removed from the device 10 for short periods, power to the main oscillator 16 is lost. When the battery 12 is removed from the device 10, this is detected by a control block 22, which causes the energy from the charge store 20 to be used to power a low power (and relatively low precision) secondary oscillator 24. Pulses generated by the secondary oscillator 24 are counted by a secondary oscillator pulse counter 26.

When the battery 12 is reinserted, power is again supplied to the main oscillator 16. At this time, the count of pulses generated by the secondary oscillator 24 is decremented. Although the frequency of the secondary oscillator 24 is not known with great accuracy, it can be assumed that this frequency is constant between the period while the battery was removed and the period immediately after the battery is reinserted. Therefore, a recovery period can be created, when the secondary oscillator 24 is used to ensure a known relationship between the duration of the recovery period and the duration of the power removal period.

At the same time, pulses generated by the main oscillator 16 are counted by the main oscillator pulse counter 18 at an increased rate for the recovery period. The increased rate is set so that, at the end of the recovery period, the count of pulses generated by the main oscillator has recovered to the value that it would have reached if the battery had not been removed.

Figure 2:
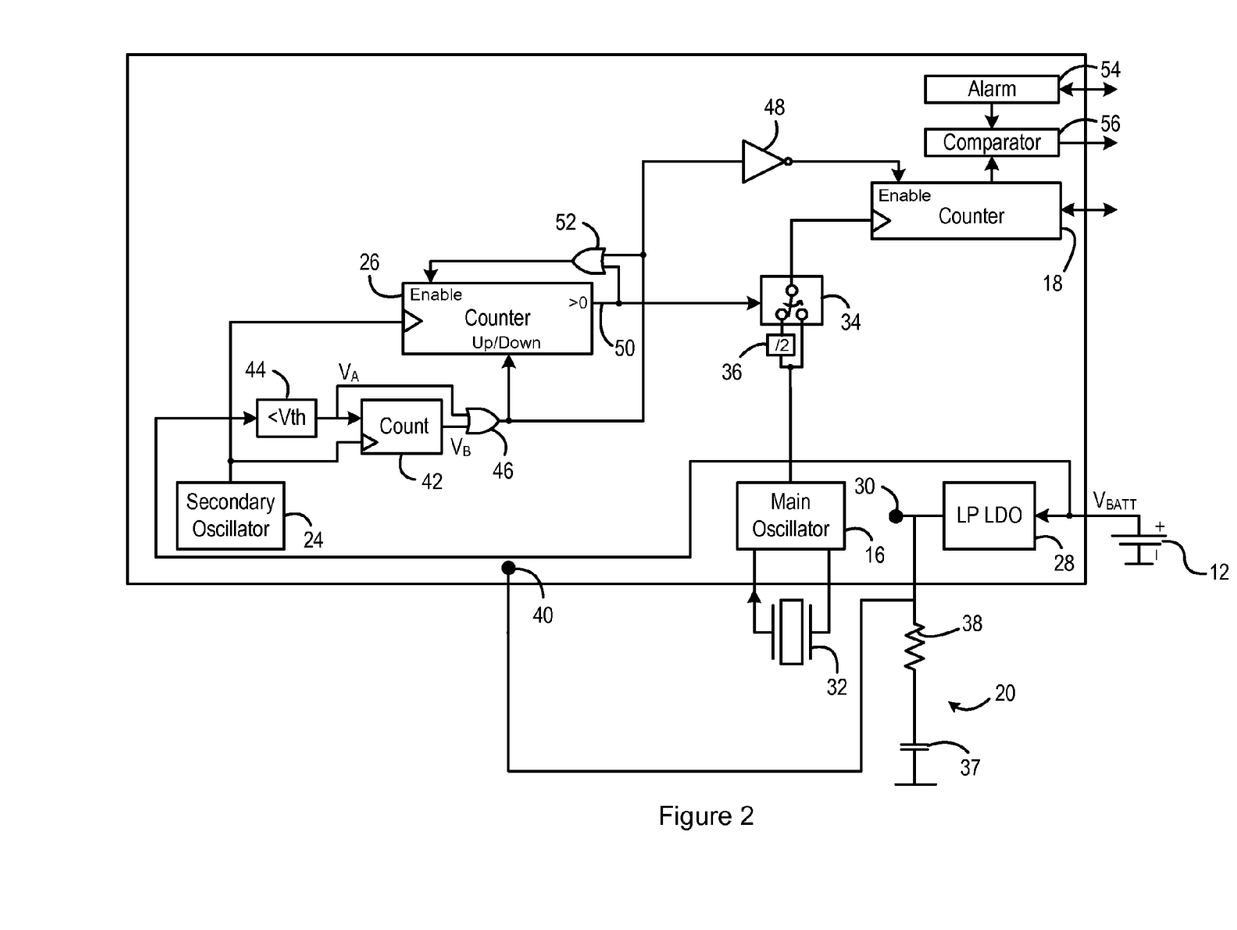
FIG. 2 is a circuit diagram, illustrating a first timing recovery circuit.

FIG. 2 is a more detailed schematic diagram of the clock recovery circuit 14 and associated circuitry.

Thus, as shown in FIG. 2, the battery 12 is connected through a low power (LP) low dropout (LDO) regulator 28 to a pin 30, which is connected to the oscillator circuit 16 to provide power thereto. The oscillator circuit 16 is connected to a crystal oscillator 32, and is able to generate pulses at a frequency of 32.768 kHz.

The oscillator 16 is connected to the main oscillator counter 18 through a switch 34. Pulses from the oscillator 16 are passed to a first input of the switch 34 through a divide-by-2 block 36 and are passed undivided to a second input of the switch 34.

The regulator 28 is also connected to the charge store 20, which includes a small back-up capacitor 37 for storing the charge and a resistor 38. The charge store 20 is also connected to a pin 40, which is connected to the secondary low-power oscillator circuit 24 to provide power thereto. The secondary oscillator 24 can be of relatively low precision, meaning that its frequency might not be known to a high degree of accuracy, because of initial tolerances and temperature drift, but it might for example be in the range of 26-56 kHz. For example, the secondary oscillator 24 may be a very low power simple oscillator, such as an RC circuit, which can be implemented completely internal to an ASIC that contains the clock recovery circuit 14. As described below, the secondary oscillator 24 does not require any factory calibration, or any other calibration prior to use.

The secondary oscillator 24 is connected to the secondary counter 26. In addition, the secondary oscillator 24 is connected to a stability counter 42, which also receives an enable input from a threshold circuit 44, which provides a signal when it detects that the voltage from the battery 12 has fallen below the threshold value, namely when the battery 12 has been removed.

The outputs from the threshold circuit 44 and the stability counter 42 are also passed to an OR gate 46. The output from the OR gate 46 is passed through an inverter 48 to an enable input of the first counter 18. The output from the OR gate 46 is also passed to an up/down control input of the second counter 26. The second counter 26 provides an output on its output terminal 50 when its count value is greater than zero. The output from the OR gate 46, and the signal on the output terminal 50 of the second counter 26 are combined in a further OR gate 52, with the result being passed to an enable input of the second counter 26.

The circuit shown in FIG. 2 also allows an alarm value, that is, a time value at which an alarm is requested by the user, to be set in the alarm register 54, and includes a comparator 56, for determining when the count value in the main counter 18 reaches the set alarm value, so that an alarm can be generated.

The operation of the circuit shown in FIG. 2 will now be described in more detail, with reference to the flow chart of FIG. 3 and the signal timing diagram of FIG. 4.

Figure 3:
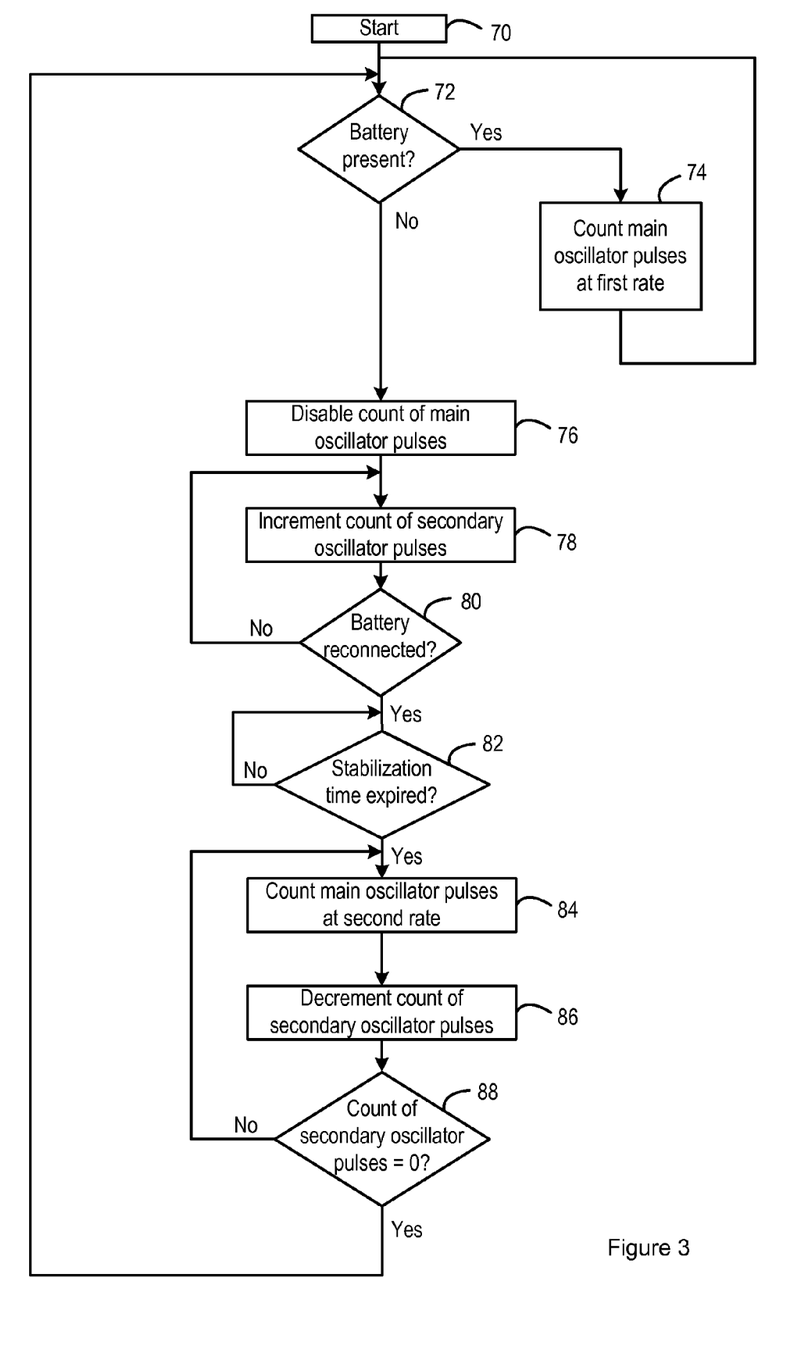
FIG. 3 is a flow chart, illustrating a method of operation of the first timing recovery circuit.
Figure 4:
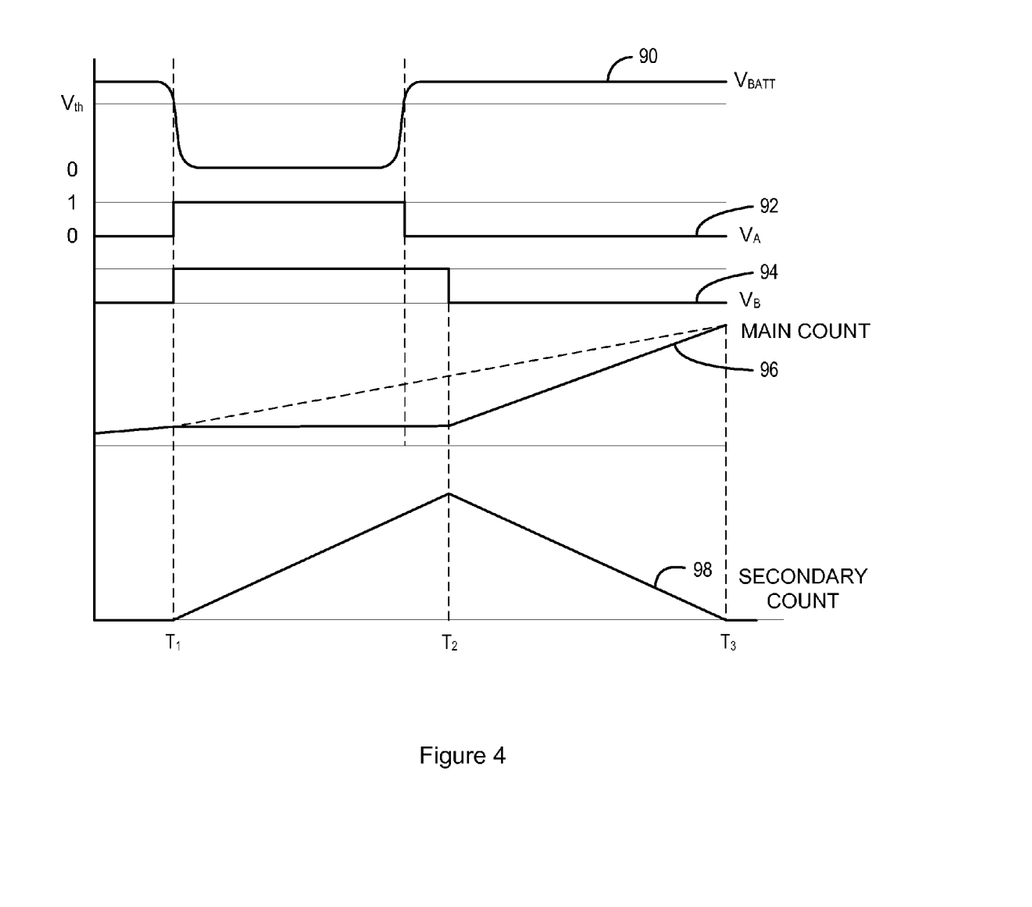
FIG. 4 is a timing diagram, illustrating signals generated during operation of the circuit of FIG. 2.

FIG. 3 shows the process performed by the circuit of FIG. 2 in this embodiment.

The process starts at step 70, when the device 10 is in operation. At step 72, it is determined whether the battery 12 is present. If the battery is present, the voltage $V_{BATT}$ is greater than the threshold voltage $V_{TH}$, as shown by line 90 in FIG. 4. During this period, pulses are generated by the main oscillator 16, and the main counter 18 is enabled, so that the pulses are counted, as shown at step 74 in FIG. 3, and the main count value is continuously increasing, as shown by line 96 in FIG. 4. During this period, the secondary counter 26 has not been enabled, and so the secondary count value is not greater than zero, and so the switch 34 is controlled so that the pulses generated by the main oscillator 16 are passed through the divide-by-2 block 36, with the result that the pulses are counted at a first rate, which is a fraction, in this case one half, of the rate at which they are generated.

If the battery 12 is removed from the device, the voltage $V_{BATT}$ soon falls below the threshold voltage $V_{TH}$, at the time $T_1$ shown in FIG. 4. At this time, it is determined that the battery 12 is not present. At this point, it is no longer possible to rely on the main oscillator 16 to provide pulses at the intended frequency, even if it is still able to generate some pulses.

When the voltage $V_{BATT}$ falls below the threshold voltage $V_{TH}$, the threshold block 44 outputs a positive signal $V_A$, as shown by the line 92 in FIG. 4. The result is that the OR gate 46 provides a positive output, which is inverted by the inverter 48, so that the positive signal is removed from the enable input of the main counter 18, thereby disabling the count of the main oscillator pulses, as shown at step 76 in FIG. 3. The effect of this is that the main count value 96 is frozen, and remains constant after $T_1$, as shown in FIG. 4.

Also, the positive output of the OR gate 46 causes the OR gate 52 to generate a positive input for the enable input of the secondary counter 26, and is also passed to the up/down input of the secondary counter. The result is that pulses generated by the secondary oscillator 24, which is receiving its power from the backup charge store 20, are counted up in the secondary oscillator 24, as shown at step 78 in FIG. 3. The secondary count value 98 thus increases after $T_1$.

During this battery removal period, it is continually tested whether the battery has been reinserted, as shown at step 80 in FIG. 3, by determining whether the voltage $V_{BATT}$ remains below the threshold voltage $V_{TH}$.

When the battery is reinserted, the voltage $V_{BATT}$ quickly rises above the threshold voltage $V_{TH}$. As shown by line 90 in FIG. 4, and the voltage $V_A$ falls to zero. However, the counter 42 continues to count pulses from the secondary oscillator 24 for a stabilization time period, until the main oscillator 16 has restarted stable operation. It is only when the stabilization time period expires, as determined at step 82 in FIG. 3, at the time $T_2$ shown in FIG. 4, that the voltage $V_B$ falls to zero, as shown by line 94 in FIG. 4.

The stabilization period set by the counter 42 therefore effectively forms part of the battery removal period, in this embodiment.

During the subsequent recovery period, the secondary count value is positive, and so the switch 34 is controlled so that the pulses generated by the main oscillator 16 are not passed through the divide-by-2 block 36, with the result that the pulses are passed through at a second rate, which is equal to the rate at which they are generated. At the same time, the voltages $V_A$ and $V_B$ are both zero, and so there is no positive output from the OR gate 46. The inverter 48 therefore causes a signal to be passed to the enable input of the main counter 18, with the result that the main oscillator pulses are counted at the second rate, as shown at step 84 of FIG. 3. The effect of this is that the main count value 96 increases after time $T_2$ at a rate which is double the rate at which it increased before $T_1$.

Also, at the same time, the zero output from the OR gate 46 is passed to the up/down input of the secondary counter, and so the pulses received at the secondary counter 26 are now used to decrement the count value, as shown at step 86 of FIG. 3.

This situation persists until time $T_3$, at which it is determined in step 88 of FIG. 3 that the count value in the secondary counter 26 has fallen to zero. At this time, the two inputs to the OR gate 52 are both zero, and so the enable input to the secondary counter 26 is removed and the count value is frozen at zero. In addition, the secondary count value is no longer greater than zero, and so the switch 34 is again controlled so that the pulses generated by the main oscillator 16 are passed through the divide-by-2 block 36, with the result that, after time $T_3$, the pulses are again counted at the first rate, namely one half of the rate at which they are generated.

Thus, although the secondary oscillator 24 has a relatively wide tolerance, and its frequency may drift greatly with temperature, its frequency can be assumed to be constant during the relatively short period while the battery 12 is removed. The effect of this process is that, although the maximum value of the secondary count that is reached at time $T_2$ cannot be relied upon to have any particular meaning, the lengths of the battery removal period (including the stabilization period in this embodiment), $T_1$–$T_2$, and the recovery period $T_2$–$T_3$, can be assumed to be equal. As the main count value is not increased during the battery removal period, but increases at twice the normal rate during the recovery period, the main count value will return by time $T_3$ to the value that it would have reached if it had been allowed to continue increasing at the normal rate for the whole period.

The count value can therefore be used as a measure of the time of day. For example, it can be compared with the set alarm time, and the alarm can be generated when the count value is found by the comparator 56 to be equal to the value stored in the register 54. Although any alarm that was scheduled to occur during the battery removal period or during the recovery period will now occur later in the recovery period, the difference will be small provided that the battery removal period has a short duration. Any alarm that was scheduled to occur during the recovery period will occur at the intended time.

In the event that the battery is removed for a second time while still in the recovery period, the operation should resume as previously described, with the secondary counter 26 resuming an upward count from the value that it had reached during the downward count. When the battery is reinserted, an extended recovery period takes place. When the secondary counter finally reaches zero, the main counter 18 will have reached the correct value.

The circuit shown in FIG. 2 therefore compensates for the battery removal period by means of a recovery period of the same duration, during which the pulses from the main oscillator are counted at twice the normal rate. More generally, a battery removal period can be compensated by means of a recovery period, having a duration equal to the battery removal period divided by X, during which the pulses are counted at the normal rate multiplied by Y, provided that X=Y-1. In the circuit shown in FIG. 1, X=1 and Y=2.

Figure 5:
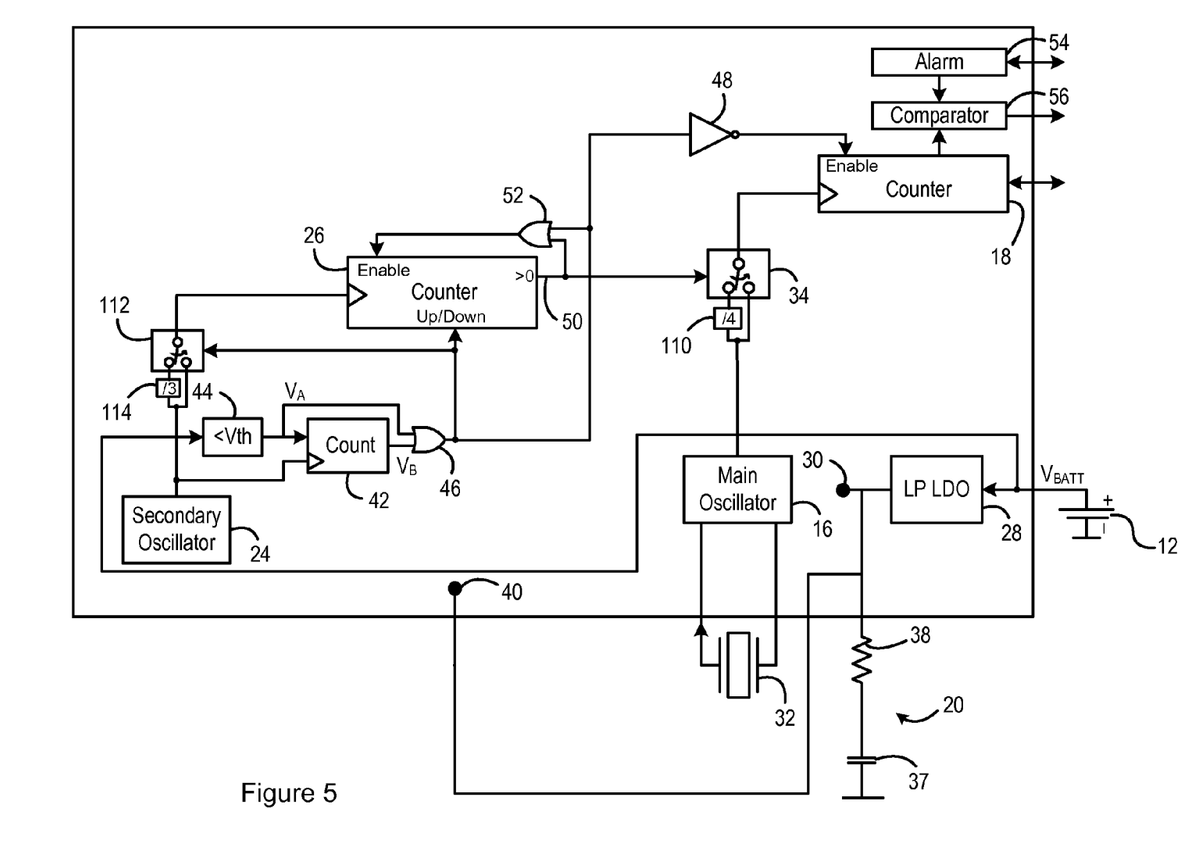
FIG. 5 is a circuit diagram, illustrating a second timing recovery circuit.

More generally, Y is advantageously an integer power of 2, so that the block 36 can be replaced by any divide-by-Y block, which can then be implemented relatively simply by means of a binary counter. FIG. 5 shows an alternative embodiment, in which X=3 and Y=4.

The circuit shown in FIG. 5 is generally similar to that shown in FIG. 2, and components having the same functions are indicated by the same reference numerals, and will not be described further herein.

In the circuit of FIG. 5, pulses from the main oscillator 16 are passed to the first input of the switch 34 through a divide-by-4 block 110, and are passed undivided to the second input of the switch 34. In addition, pulses from the secondary oscillator 24 are passed to a first input of a switch 112 through a divide-by-3 block 114 and are passed undivided to a second input of the switch 112. The output of the switch 112 is connected to the input of the secondary counter 26, and the switch 112 is controlled by the output of the OR gate 46.

Figure 6:
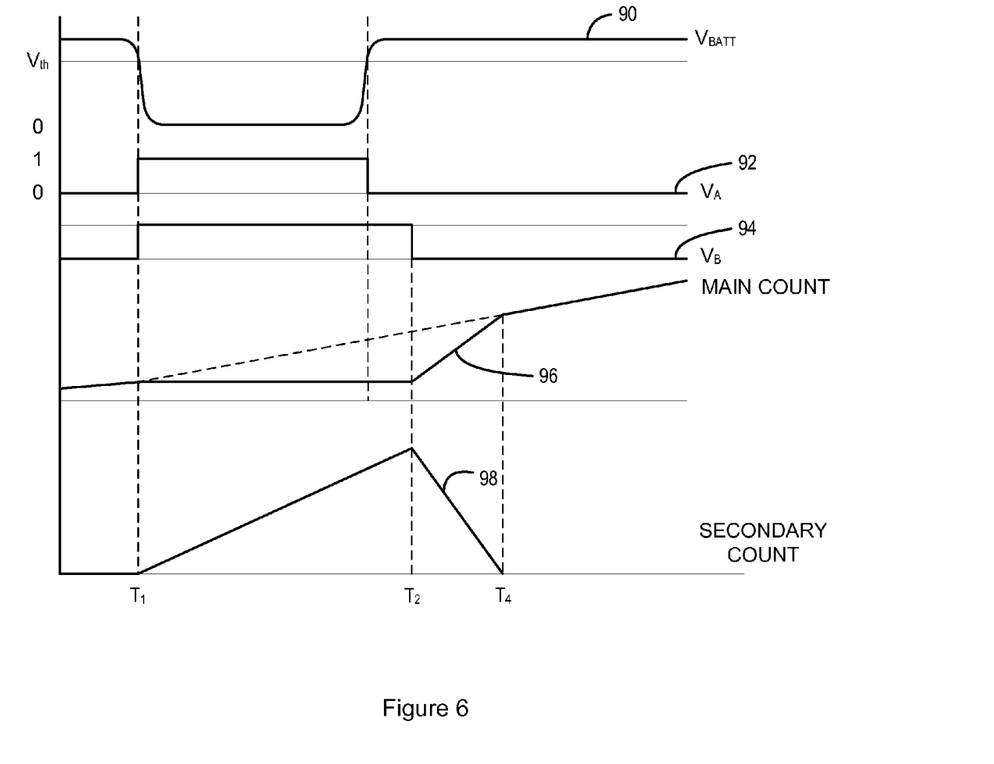
FIG. 6 is a timing diagram, illustrating signals generated during operation of the circuit of FIG. 5.

FIG. 6 illustrates the operation of the circuit of FIG. 5. During the battery removal period $T_1$–$T_2$, the switch 112 is controlled so that the pulses from the secondary oscillator 24 that have passed through the divide-by-3 block 114 are passed to the input of the secondary counter 26. The result is that the secondary count value increases at one third of the rate at which it increased in FIG. 4 (the vertical scales of FIGS. 4 and 6 are not the same, so that this difference is not apparent).

During the recovery period $T_2$–$T_4$, the switch 112 is controlled so that the pulses from the secondary oscillator 24 that have not passed through the divide-by-3 block 114 are passed to the input of the secondary counter 26. The result is that the secondary count value decrements at three times the rate at which it increased during the battery removal period, and hence that the duration of the recovery period $T_2$–$T_4$ is one third of the duration of the battery removal period $T_1$–$T_2$.

At the same time, the fact that the pulses from the main oscillator 16 that are counted have been passed to the main counter 18 through the divide-by-4 block 110 before the time $T_1$, and have not been passed through the divide-by-4 block 110 during the recovery period means that the main count value increases during the recovery period at a second rate that is four times the normal rate.

The effect of this combination of features is that, by the time $T_4$, the main count value has recovered to the value that it would have reached if it had been incrementing at the first rate throughout the battery removal period and the recovery period.

The embodiments described so far are particularly suitable for situations in which the battery is reinserted into the device, but the device remains powered down. Where the device is powered on during the recovery period, it may be advantageous to be able to recover the main count value immediately.

Figure 7:
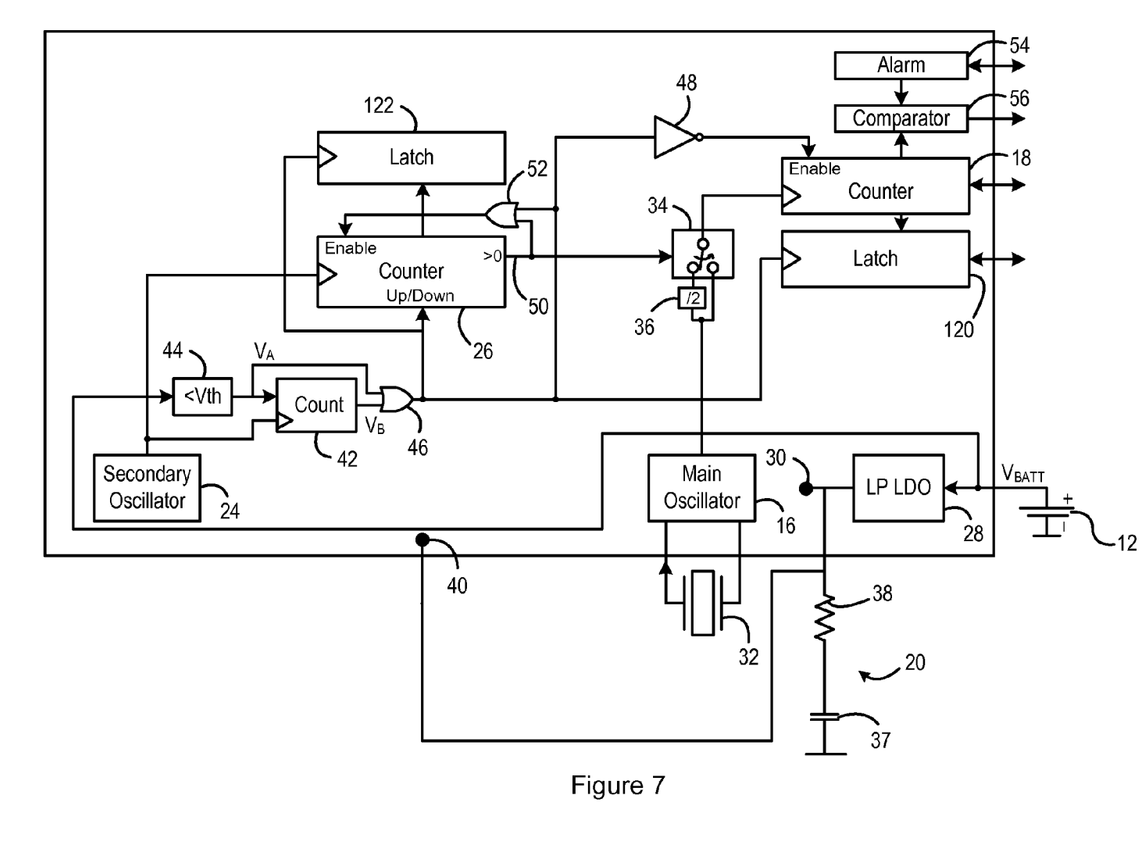
FIG. 7 is a circuit diagram, illustrating a third timing recovery circuit.

FIG. 7 is a circuit diagram of a further embodiment, in which this is possible. The circuit shown in FIG. 7 is generally similar to that shown in FIG. 2, and components having the same functions are indicated by the same reference numerals, and will not be described further herein.

Figure 8:
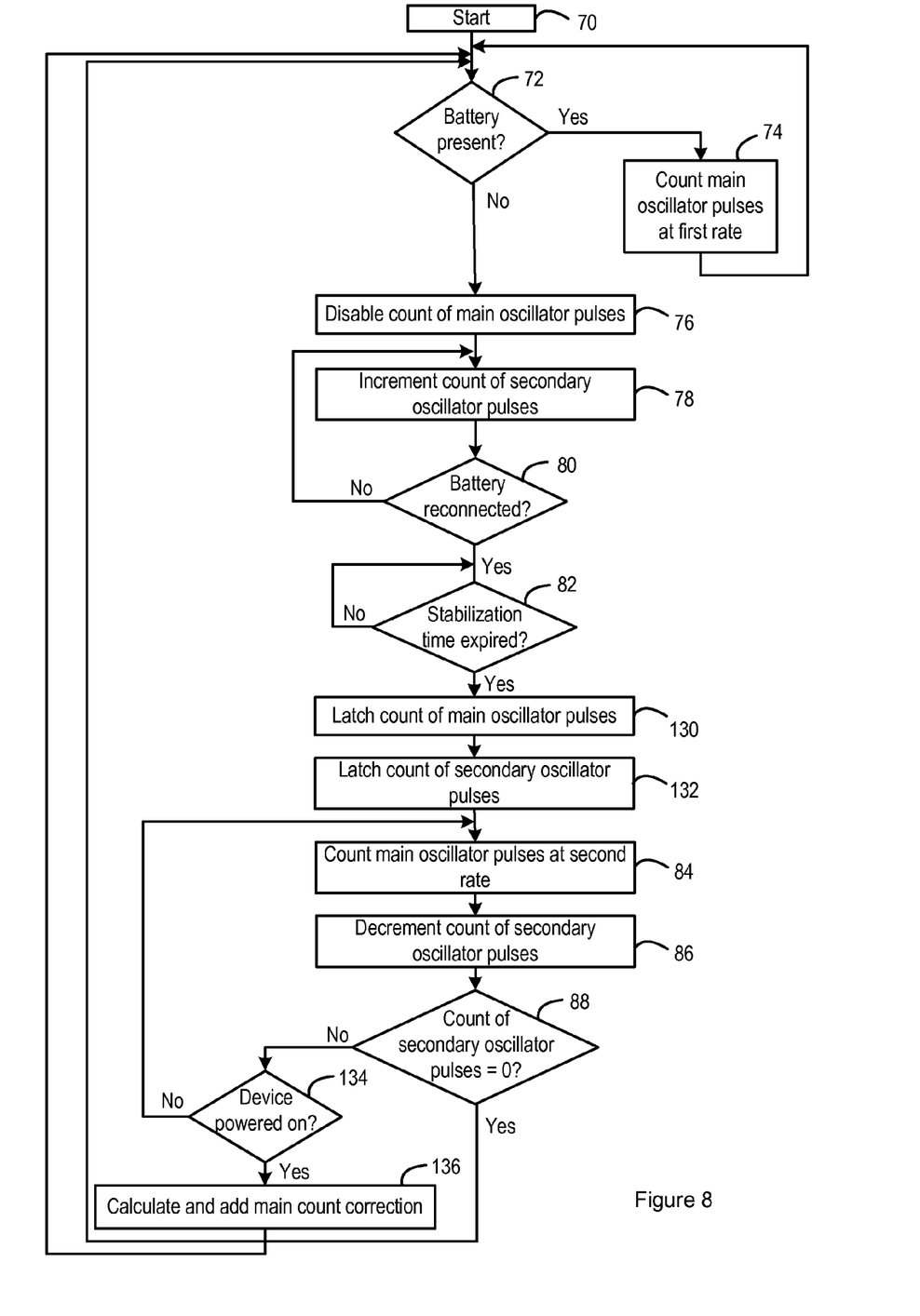
FIG. 8 is a flow chart, illustrating a method of operation of the third timing recovery circuit.

FIG. 8 is a flow chart, illustrating the method of operation of the circuit of FIG. 7. The method of FIG. 8 is generally similar to that shown in FIG. 3, and corresponding steps are indicated by the same reference numerals, and will not be described further herein.

In the circuit of FIG. 7, a main count latch 120 is connected to the main counter 18, and a secondary count latch 122 is connected to the secondary counter 26.

As shown in FIG. 8, the main count value is latched in step 130 and the secondary count value is latched in step 132, at the time $T_2$. Then, while the secondary count value is decrementing during the recovery period, it is determined in step 134 whether the device has been powered on. If so, then, in step 136, at time $T_5$, a main count correction value $C_1$ is calculated, the main count correction value $C_1$ being the value that needs to be added to the main count value in order to bring it up to the value that it would have reached if it had been incrementing at the first rate throughout the battery removal period and the recovery period to date. The process then returns to the start.

Where the first rate, i.e. the rate at which the main count increments during the battery removal period, is $R_1$ and the second rate, i.e. the rate at which the main count increments during the recovery period, is $R_2$, the correction value $C_1$ is given by:

$$C_1 = R_1(T_5 - T_1) - R_2(T_5 - T_2)$$

Of course, none of these parameter values is known directly, but the correction value $C_1$ can be deduced from knowledge of: the main count value $MC_L$ latched in step 130 at the time $T_2$, the secondary count value $SC_L$ latched in step 132 at the time $T_2$, the main count value $MC_F$ at the time $T_5$, the secondary count value $SC_F$ at the time $T_5$, and the known ratio Y of $R_2$ and $R_1$, Y of course having the value 2 in the embodiment shown in FIG. 7. Specifically:

$$C_1 = (MC_F - MC_L) \cdot \frac{(Y-1)}{Y} \cdot \left( \frac{SC_L}{(SC_L - SC_F)} - 1 \right)$$

This correction value can be calculated with sufficient accuracy, provided that the recovery period has been running for long enough that the division by the term $(SC_L - SC_F)$ does not introduce any significant error. Thus, fast recovery of the lost count is possible during the recovery process by measuring how much correction has already been provided and calculating what further correction should be added.

As before, this calculation can be performed while also using a value of Y that is greater than 2, in order to shorten the normal recovery period. A suitable circuit is shown in FIG. 10, being generally similar to that shown in FIG. 7, with components having the same functions being indicated by the same reference numerals, and not being described further herein.

Figure 10:
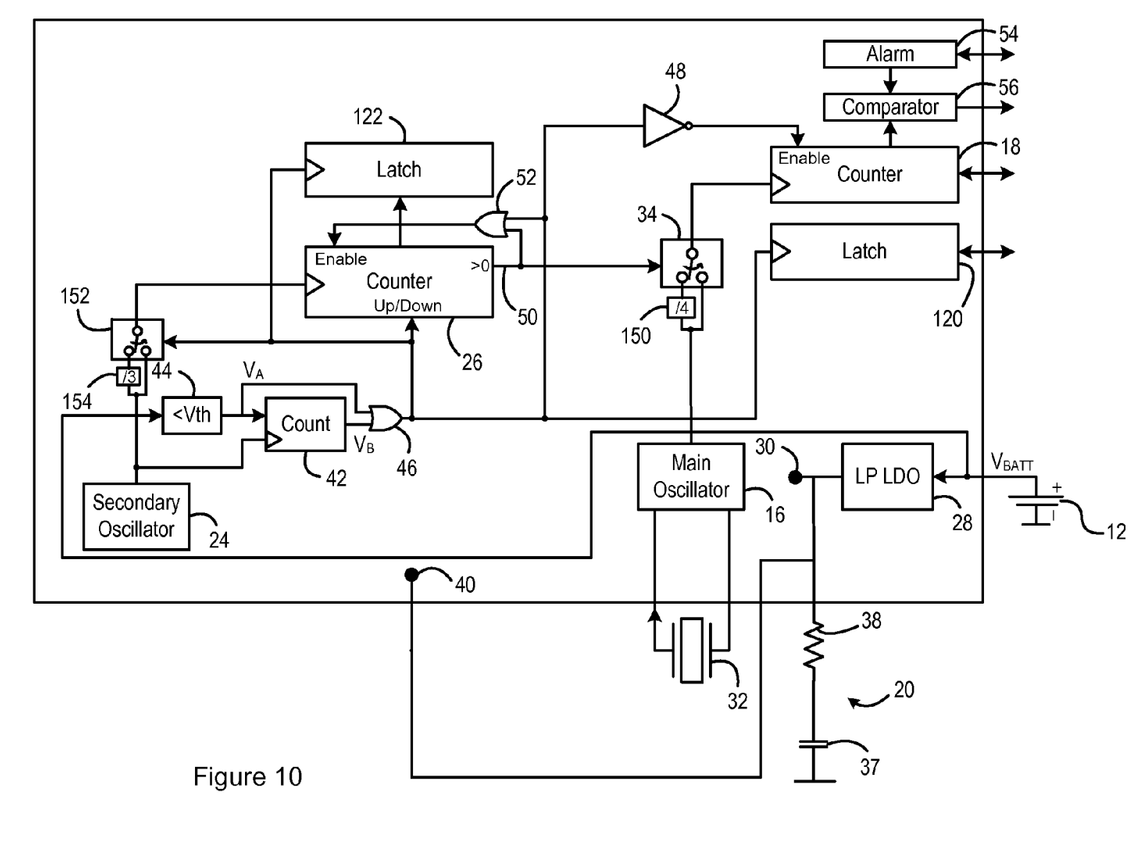
FIG. 10 is a circuit diagram, illustrating a fourth timing recovery circuit.

In the circuit of FIG. 10, pulses from the main oscillator 16 are passed to the first input of the switch 34 through a divide-by-4 block 150, and are passed undivided to the second input of the switch 34. In addition, pulses from the secondary oscillator 24 are passed to a first input of a switch 152 through a divide-by-3 block 154 and are passed undivided to a second input of the switch 152. The output of the switch 152 is connected to the input of the secondary counter 26, and the switch 152 is controlled by the output of the OR gate 46.

Figure 9:
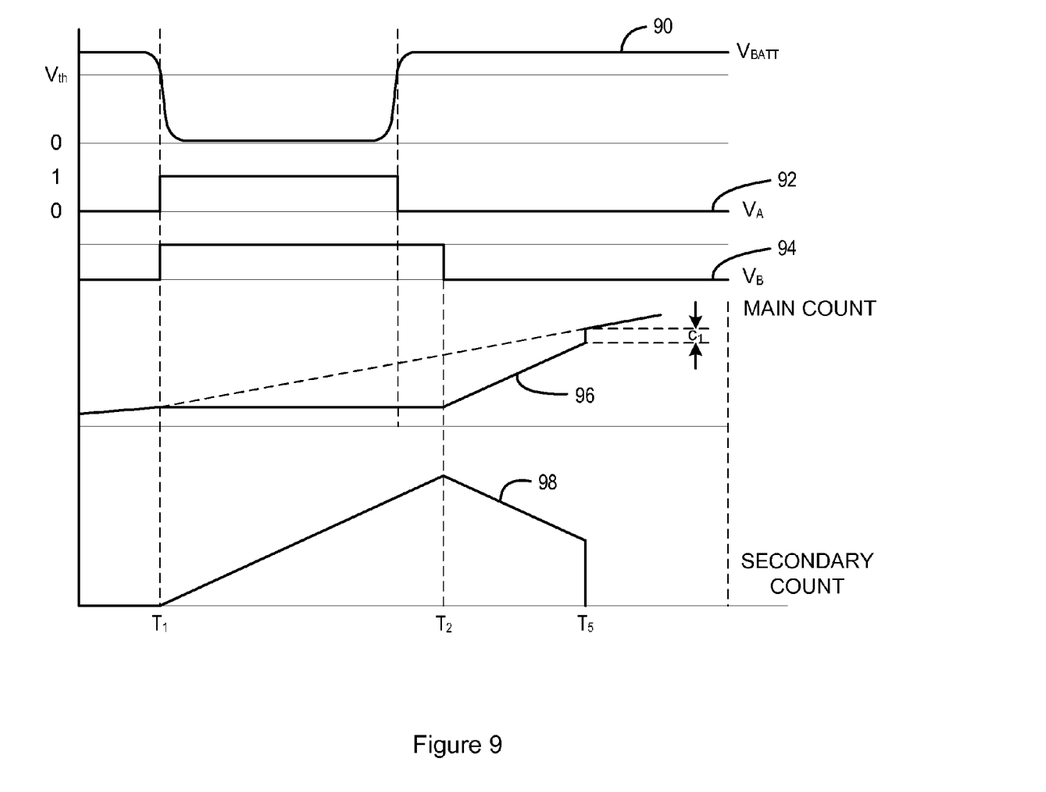
FIG. 9 is a timing diagram, illustrating signals generated during operation of the circuit of FIG. 7.
Figure 11:
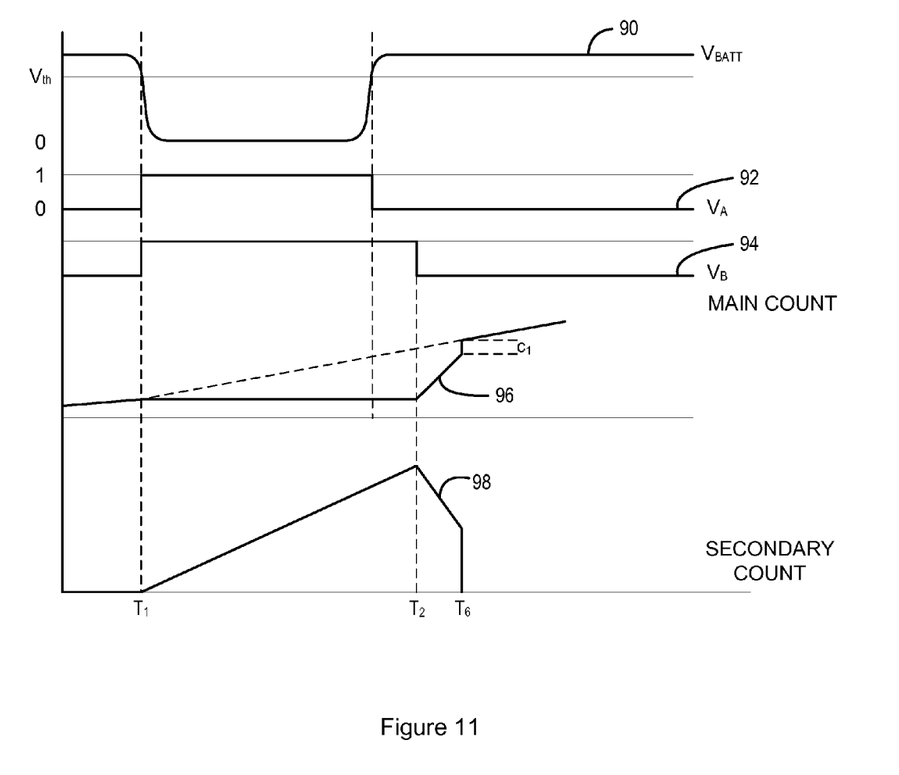
FIG. 11 is a timing diagram, illustrating signals generated during operation of the circuit of FIG. 10.

FIG. 11 illustrates the operation of the circuit of FIG. 10. During the battery removal period $T_1 - T_2$, the switch 152 is controlled so that the pulses from the secondary oscillator 24 that have passed through the divide-by-3 block 154 are passed to the input of the secondary counter 26. The result is that the secondary count value increases at one third of the rate at which it increased in FIG. 9 (the vertical scales of FIGS. 9 and 11 are not the same, so that this difference is not apparent).

During the recovery period $T_2 - T_6$, the switch 152 is controlled so that the pulses from the secondary oscillator 24 that have not passed through the divide-by-3 block 154 are passed to the input of the secondary counter 26. The result is that the secondary count value decrements at three times the rate at which it increased during the battery removal period, and hence that the maximum duration of the recovery period is one third of the duration of the battery removal period $T_1 - T_2$.

At the same time, the fact that the pulses from the main oscillator 16 that are counted have been passed to the main counter 18 through the divide-by-4 block 150 before the time $T_1$, and have not been passed through the divide-by-4 block 150 during the recovery period means that the main count value increases during the recovery period at a second rate that is four times the normal rate, i.e. Y=4.

The circuit follows the process outlined in FIG. 8 and so, if the device is powered up at time $T_6$ before the recovery period has ended, the required additional correction value $C_1$ can be calculated as described above.

There are thus described a method, and a circuit, for counting pulses in a manner that can be used to indicate a time of day, even when a battery that is supplying power to a main oscillator is temporarily removed from the circuit.

The invention claimed is:

1. A method of updating a first counter in an electronic device, a value of the first counter representing a time, comprising:
   counting, during a first time period, clock pulses derived from a first oscillator in the first counter at a first rate;
   keeping, during a second time period following the first time period, a value of the first counter independent of clock pulses derived from the first oscillator during the second time period;
   counting, during the second time period, clock pulses derived from a second oscillator in a second counter;
   counting, during a recovery time period following the second time period, clock pulses derived from the second oscillator in the second counter; and
   counting, during the recovery time period, clock pulses derived from the first oscillator in the first counter at a second rate higher than the first rate, a duration of the recovery time period being determined based on the number of pulses counted in the second counter during the second time period.

2. A method in accordance with claim 1, comprising starting the second time period when it is determined that power has been removed from the first oscillator.

3. A method in accordance with claim 1, wherein the recovery time period is ended when the number of clock pulses derived from the second oscillator counted in the second counter during the recovery time period, is equal to the number of clock pulses derived from the second oscillator counted in the second counter during the second time period.

4. A method in accordance with claim 1, wherein the recovery time period is equivalent to the second time period.

5. A method in accordance with claim 1, wherein during the second time period the second counter is incremented from a first value to a second value with each clock pulse derived from the second oscillator during the second time period;
during the recovery time period the second counter is decremented with each clock pulse derived from the second oscillator during the recovery time period until the second counter reaches a third value; and
after the recovery period, clock pulses derived from the first oscillator are counted in the first counter at the first rate.

6. A method in accordance with claim 5, wherein the first value and the third value are equal.

7. A method in accordance with claim 6, wherein the first and the third value are 0.

8. A method as claimed in claim 1, comprising:
determining, at a time point during the recovery time period, a recovered value of the first counter by estimating by extrapolation a value that the first counter would have had had the first counter continued counting pulses generated derived from the first oscillator at the first rate throughout the second period and until said time point; and
updating the first counter to the recovered value.

9. A method as claimed in claim 1, wherein the second rate is double the first rate.

10. A method as claimed in claim 1, wherein the second rate is (r+1) times the first rate, where r is an integer.

11. A method as claimed in claim 2, wherein the second time period includes a time period after a time at which it is detected that power has been restored to the first oscillator, in order to allow the first oscillator to stabilize before the recovery time period.

12. A method as claimed in claim 1, further comprising determining, after the second time period, a time of day based on the value of the first counter.

13. An electronic device, comprising:
a first oscillator, for generating clock pulses;
a first counter, wherein a value of the first counter represents a time;
a second oscillator, for generating clock pulses; and
a second counter,
wherein the first counter is connected to the first oscillator such that, during a first time period, clock pulses derived from the first oscillator are counted in the first counter at a first rate, and, during a second time period following the first time period, the value of the first counter is kept independent of clock pulses derived from the first oscillator;
wherein the second counter is connected to the second oscillator such that, during the second time period, clock pulses derived from the second oscillator are counted in the second counter, and, during a recovery time period following the second time period, clock pulses derived from the second oscillator are counted in the second counter; and
wherein the first counter is further connected to the first oscillator such that, during the recovery time period, clock pulses derived from the first oscillator are counted in the first counter at a second rate higher than the first rate, a duration of the recovery time period being determined based on the number of pulses counted in the second counter during the second time period.

14. An electronic device in accordance with claim 13, wherein the second counter is connected to the second oscillator such that:
during the second time period the second counter is incremented from a first value to a second value with each clock pulse derived from the second oscillator;
during the recovery time period the second counter is decremented with each clock pulse derived from the second oscillator until the second counter reaches a third value; and
the third value is equal to the first value, such that the recovery time period is ended when the number of clock pulses derived from the second oscillator counted in the second counter during the recovery time period, is equal to the number of clock pulses derived from the second oscillator counted in the second counter during the second time period.

15. An electronic device as claimed in claim 13, wherein the second counter is adapted to count the second time period including a time period after a time at which it is detected that power has been restored to the first oscillator, in order to allow the first oscillator to stabilize before the recovery time period.

* * * * *